US006975679B2

(12) United States Patent
Bowling

(10) Patent No.: US 6,975,679 B2
(45) Date of Patent: Dec. 13, 2005

(54) CONFIGURATION FUSES FOR SETTING PWM OPTIONS

(75) Inventor: Stephen A. Bowling, Chandler, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 718 days.

(21) Appl. No.: 09/870,454

(22) Filed: Jun. 1, 2001

(65) Prior Publication Data

US 2002/0181577 A1 Dec. 5, 2002

(51) Int. Cl.[7] .............................................. H03K 7/08
(52) U.S. Cl. ..................... 375/238; 326/38; 326/48; 326/56; 332/109
(58) Field of Search ................. 375/238; 327/108; 326/63, 98, 56, 48, 38, 27; 713/320; 332/109

(56) References Cited

U.S. PATENT DOCUMENTS

| | | | |
|---|---|---|---|
| 3,771,146 A | 11/1973 | Cotton et al. ............... 710/260 |
| 3,781,810 A | 12/1973 | Downing | |
| 3,886,524 A | 5/1975 | Appell ........................ 710/110 |
| 3,930,253 A | 12/1975 | Maida ......................... 340/347 |
| 4,025,771 A | 5/1977 | Lynch et al. ................ 708/521 |
| 4,074,353 A | 2/1978 | Woods et al. ............... 710/264 |
| 4,090,250 A | 5/1978 | Carlson et al. ............. 712/234 |
| 4,323,981 A | 4/1982 | Nakamura ................... 364/749 |
| 4,379,338 A | 4/1983 | Nishitani et al. ........... 708/552 |
| 4,398,244 A | 8/1983 | Chu et al. | |
| 4,408,274 A | 10/1983 | Wheatley et al. ............ 364/200 |
| 4,451,885 A | 5/1984 | Gerson et al. ............... 708/200 |
| 4,472,788 A | 9/1984 | Yamazaki | |
| 4,481,576 A | 11/1984 | Bicknell | |
| 4,488,252 A | 12/1984 | Vassar | |
| 4,511,990 A | 4/1985 | Hagiwara et al. | |
| 4,556,938 A | 12/1985 | Parker et al. | |
| 4,615,005 A | 9/1986 | Maejima et al. ............. 713/601 |
| 4,626,988 A | 12/1986 | George | |
| 4,709,324 A | 11/1987 | Kloker ........................ 364/200 |
| 4,730,248 A | 3/1988 | Watanabe et al. | |
| 4,742,479 A | 5/1988 | Kloker et al. ................ 364/746 |
| 4,768,149 A | 8/1988 | Konopik et al. ............. 364/200 |
| 4,779,191 A | 10/1988 | Greenblatt ...................... 711/2 |
| 4,782,457 A | 11/1988 | Cline | |
| 4,800,524 A | 1/1989 | Roesgen ...................... 364/900 |
| 4,807,172 A | 2/1989 | Nukiyama | |
| 4,829,420 A | 5/1989 | Stahle | |
| 4,829,460 A | 5/1989 | Ito | |

(Continued)

FOREIGN PATENT DOCUMENTS

EP 0 554 917 A2 8/1993 ............. G06F 9/26

(Continued)

OTHER PUBLICATIONS

SPARC, International, Inc., "The SPARC Architecture Manual", Version 8, pp 1-303.

(Continued)

Primary Examiner—Shuwang Liu
Assistant Examiner—Ted Wang
(74) Attorney, Agent, or Firm—Baker Botts L.L.P.

(57) ABSTRACT

Configuration bits are provided that configure PWM outputs of a processor incorporating a PWM module. The configuration bits cause the PWM module to put the PWM outputs into tri-state, active high or active low modes when the PWM module is inactive or when individual PWM outputs are not enabled. The configuration bits are stored in non-volatile memory and perform the configuration after power-up of the processor and after a reset when the PWM module is generally in an inactive state.

20 Claims, 5 Drawing Sheets

U.S. PATENT DOCUMENTS

| | | | |
|---|---|---|---|
| 4,839,846 A | 6/1989 | Hirose et al. | |
| 4,841,468 A | 6/1989 | Miller et al. | 708/625 |
| 4,872,128 A | 10/1989 | Shimizu | |
| 4,882,701 A | 11/1989 | Ishii | |
| 4,926,371 A | 5/1990 | Vassiliadis et al. | 708/628 |
| 4,941,120 A | 7/1990 | Brown et al. | |
| 4,943,940 A | 7/1990 | New | |
| 4,945,507 A | 7/1990 | Ishida et al. | 708/530 |
| 4,959,776 A | 9/1990 | Deerfield et al. | |
| 4,977,533 A | 12/1990 | Miyabayashi et al. | |
| 4,984,213 A | 1/1991 | Abdoo et al. | |
| 5,007,020 A | 4/1991 | Inskeep | |
| 5,012,441 A | 4/1991 | Retter | |
| 5,032,986 A | 7/1991 | Pathak et al. | |
| 5,034,887 A | 7/1991 | Yasui et al. | 364/200 |
| 5,038,310 A | 8/1991 | Akagiri et al. | |
| 5,040,178 A | 8/1991 | Lindsay et al. | 371/21.5 |
| 5,056,004 A | 10/1991 | Ohde et al. | |
| 5,099,445 A | 3/1992 | Studor et al. | |
| 5,101,484 A | 3/1992 | Kohn | |
| 5,117,498 A | 5/1992 | Miller et al. | |
| 5,121,431 A | 6/1992 | Wiener | 713/174 |
| 5,122,981 A | 6/1992 | Taniguchi | |
| 5,155,823 A | 10/1992 | Tsue | |
| 5,177,373 A | 1/1993 | Nakamura | 307/265 |
| 5,197,023 A | 3/1993 | Nakayama | |
| 5,197,140 A | 3/1993 | Balmer | |
| 5,206,940 A | 4/1993 | Murakami et al. | |
| 5,212,662 A | 5/1993 | Cocanougher et al. | |
| 5,218,239 A * | 6/1993 | Boomer | 326/27 |
| 5,239,654 A | 8/1993 | Ing-Simmons et al. | 395/800 |
| 5,276,634 A | 1/1994 | Suzuki et al. | |
| 5,282,153 A | 1/1994 | Bartkowiak et al. | |
| 5,327,543 A | 7/1994 | Miura et al. | |
| 5,327,566 A | 7/1994 | Forsyth | |
| 5,375,080 A | 12/1994 | Davies | 364/736.5 |
| 5,379,240 A | 1/1995 | Byrne | |
| 5,386,563 A | 1/1995 | Thomas | 395/650 |
| 5,392,435 A | 2/1995 | Masui et al. | 395/725 |
| 5,418,976 A | 5/1995 | Iida | 395/800 |
| 5,422,805 A | 6/1995 | McIntyre et al. | 708/625 |
| 5,432,943 A | 7/1995 | Mitsuishi | 395/725 |
| 5,448,703 A | 9/1995 | Amini et al. | |
| 5,448,706 A | 9/1995 | Fleming et al. | |
| 5,450,027 A * | 9/1995 | Gabara | 326/98 |
| 5,463,749 A | 10/1995 | Wertheizer et al. | |
| 5,469,377 A | 11/1995 | Amano | |
| 5,471,600 A | 11/1995 | Nakamoto | |
| 5,497,340 A | 3/1996 | Uramoto et al. | |
| 5,499,380 A | 3/1996 | Iwata et al. | |
| 5,504,916 A | 4/1996 | Murakami et al. | 395/800 |
| 5,506,484 A | 4/1996 | Munro et al. | 318/599 |
| 5,517,436 A | 5/1996 | Andreas et al. | 364/736 |
| 5,525,874 A | 6/1996 | Mallarapu et al. | 318/254 |
| 5,548,544 A | 8/1996 | Matheny et al. | |
| 5,561,384 A * | 10/1996 | Reents et al. | 327/108 |
| 5,561,619 A | 10/1996 | Watanabe et al. | 364/736.5 |
| 5,564,028 A | 10/1996 | Swoboda et al. | 395/375 |
| 5,568,380 A | 10/1996 | Brodnax et al. | 364/184 |
| 5,568,412 A | 10/1996 | Han et al. | |
| 5,596,760 A | 1/1997 | Ueda | |
| 5,600,813 A | 2/1997 | Nakagawa et al. | |
| 5,611,061 A | 3/1997 | Yasuda | 395/591 |
| 5,619,711 A | 4/1997 | Anderson | |
| 5,623,646 A | 4/1997 | Clarke | 395/560 |
| 5,638,524 A | 6/1997 | Kiuchi et al. | 395/375 |
| 5,642,516 A | 6/1997 | Hedayat et al. | |
| 5,649,146 A | 7/1997 | Riou | 395/421.07 |
| 5,651,121 A | 7/1997 | Davies | 395/376 |
| 5,657,484 A | 8/1997 | Scarrá | 395/561 |
| 5,659,700 A | 8/1997 | Chen et al. | 395/421.07 |
| 5,682,339 A | 10/1997 | Tam | 364/715.08 |
| 5,689,693 A | 11/1997 | White | |
| 5,694,350 A | 12/1997 | Wolrich et al. | |
| 5,696,711 A | 12/1997 | Makineni | |
| 5,701,493 A | 12/1997 | Jaggar | 395/734 |
| 5,706,460 A | 1/1998 | Craig et al. | |
| 5,706,466 A | 1/1998 | Dockser | 395/452 |
| 5,715,470 A | 2/1998 | Asano et al. | |
| 5,737,570 A | 4/1998 | Koch | |
| 5,740,095 A | 4/1998 | Parant | 364/760 |
| 5,740,419 A | 4/1998 | Potter | |
| 5,740,451 A | 4/1998 | Muraki et al. | 395/733 |
| 5,748,516 A | 5/1998 | Goddard et al. | |
| 5,748,970 A | 5/1998 | Miyaji et al. | 395/733 |
| 5,764,555 A | 6/1998 | McPherson et al. | |
| 5,765,216 A | 6/1998 | Weng et al. | 711/214 |
| 5,765,218 A | 6/1998 | Ozawa et al. | 711/219 |
| 5,774,711 A | 6/1998 | Henry et al. | |
| 5,778,237 A | 7/1998 | Yamamoto et al. | 713/322 |
| 5,778,416 A | 7/1998 | Harrison et al. | |
| 5,790,443 A | 8/1998 | Shen et al. | |
| 5,808,926 A | 9/1998 | Gorshtein et al. | |
| 5,812,439 A | 9/1998 | Hansen | |
| 5,812,868 A | 9/1998 | Moyer et al. | 395/800.23 |
| 5,815,693 A | 9/1998 | McDermott et al. | 713/501 |
| 5,825,730 A | 10/1998 | Nishida et al. | |
| 5,826,072 A | 10/1998 | Knapp et al. | 395/567 |
| 5,826,096 A | 10/1998 | Baxter | |
| 5,828,875 A | 10/1998 | Halvarsson et al. | |
| 5,862,065 A | 1/1999 | Muthusamy | |
| 5,867,726 A | 2/1999 | Ohsuga et al. | 395/800.32 |
| 5,875,342 A | 2/1999 | Temple | 395/733 |
| 5,880,984 A | 3/1999 | Burchfiel et al. | |
| 5,892,697 A | 4/1999 | Brakefield | |
| 5,892,699 A | 4/1999 | Duncan et al. | |
| 5,894,428 A | 4/1999 | Harada | |
| 5,900,683 A | 5/1999 | Rinehart et al. | 307/126 |
| 5,909,385 A | 6/1999 | Nishiyama et al. | |
| 5,917,741 A | 6/1999 | Ng | |
| 5,918,252 A | 6/1999 | Chen et al. | 711/217 |
| 5,930,159 A | 7/1999 | Wong | |
| 5,930,503 A | 7/1999 | Drees | |
| 5,936,870 A | 8/1999 | Im | 364/745.03 |
| 5,937,199 A | 8/1999 | Temple | 395/335 |
| 5,938,759 A | 8/1999 | Kamijo | |
| 5,941,940 A | 8/1999 | Prasad et al. | |
| 5,943,249 A | 8/1999 | Handlogten | |
| 5,944,816 A | 8/1999 | Dutton et al. | 712/215 |
| 5,951,627 A | 9/1999 | Kiamilev et al. | |
| 5,951,679 A | 9/1999 | Anderson et al. | |
| 5,973,527 A | 10/1999 | Schweighofer et al. | 327/172 |
| 5,974,549 A | 10/1999 | Golan | 713/200 |
| 5,978,825 A | 11/1999 | Divine et al. | 708/525 |
| 5,983,333 A | 11/1999 | Kolagotla et al. | 711/219 |
| 5,991,787 A | 11/1999 | Abel et al. | |
| 5,991,868 A | 11/1999 | Kamiyama et al. | 712/32 |
| 5,996,067 A | 11/1999 | White | |
| 6,002,234 A | 12/1999 | Ohm et al. | 318/729 |
| 6,009,454 A | 12/1999 | Dummermuth | |
| 6,014,723 A | 1/2000 | Tremblay et al. | |
| 6,018,757 A | 1/2000 | Wong | 708/525 |
| 6,026,489 A | 2/2000 | Wachi et al. | |
| 6,044,392 A | 3/2000 | Anderson et al. | |
| 6,044,434 A | 3/2000 | Oliver | |
| 6,049,858 A | 4/2000 | Kolagotla et al. | 711/217 |
| 6,055,619 A | 4/2000 | North et al. | 713/36 |
| 6,058,409 A | 5/2000 | Kozaki et al. | |
| 6,058,410 A | 5/2000 | Sharangpani | |
| 6,058,464 A | 5/2000 | Taylor | |
| 6,061,711 A | 5/2000 | Song et al. | 709/108 |
| 6,061,780 A | 5/2000 | Shippy et al. | |
| 6,061,783 A | 5/2000 | Harriman | 712/224 |
| 6,076,154 A | 6/2000 | Van Eijndhoven et al. | |

| | | | |
|---|---|---|---|
| 6,084,880 A | 7/2000 | Bailey et al. | 370/395 |
| 6,101,521 A | 8/2000 | Kosiec | |
| 6,101,599 A | 8/2000 | Wright et al. | 712/228 |
| 6,115,732 A | 9/2000 | Oberman et al. | |
| 6,128,728 A | 10/2000 | Dowling | |
| 6,134,574 A | 10/2000 | Oberman et al. | |
| 6,144,980 A | 11/2000 | Oberman | 708/627 |
| 6,145,049 A | 11/2000 | Wong | |
| 6,181,151 B1 | 1/2001 | Wasson | 324/765 |
| 6,202,163 B1 | 3/2001 | Gabzdyl et al. | 713/324 |
| 6,205,467 B1 | 3/2001 | Lambrecht et al. | 709/108 |
| 6,209,086 B1 | 3/2001 | Chi et al. | 712/244 |
| 6,243,786 B1 | 6/2001 | Huang et al. | 710/262 |
| 6,243,804 B1 | 6/2001 | Cheng | 712/228 |
| 6,260,162 B1 | 7/2001 | Typaldos et al. | 714/55 |
| 6,282,637 B1 | 8/2001 | Chan et al. | 712/223 |
| 6,292,866 B1 | 9/2001 | Zaiki et al. | 710/264 |
| 6,295,574 B1 | 9/2001 | MacDonald | 710/261 |
| 6,300,800 B1 * | 10/2001 | Schmitt et al. | 326/86 |
| 6,315,200 B1 | 11/2001 | Silverbrook et al. | 235/454 |
| 6,356,970 B1 | 3/2002 | Killian et al. | 710/269 |
| 6,377,619 B1 | 4/2002 | Denk et al. | 375/232 |
| 6,397,318 B1 | 5/2002 | Peh | 711/220 |
| 6,412,081 B1 | 6/2002 | Koscal et al. | 714/34 |
| 6,434,020 B1 | 8/2002 | Lambert et al. | 363/17 |
| 6,487,654 B2 | 11/2002 | Dowling | 712/244 |
| 6,523,108 B1 | 2/2003 | James et al. | 712/224 |
| 6,552,625 B2 | 4/2003 | Bowling | 332/109 |
| 6,564,238 B1 | 5/2003 | Kim et al. | 708/513 |
| 6,633,970 B1 | 10/2003 | Clift et al. | 712/217 |
| 6,643,150 B2 | 11/2003 | Kawakami | 363/41 |
| 6,658,578 B1 | 12/2003 | Laurenti et al. | 713/324 |
| 6,681,280 B1 | 1/2004 | Miyake et al. | 710/261 |
| 6,694,398 B1 | 2/2004 | Zhao et al. | 710/260 |
| 6,724,169 B2 | 4/2004 | Majumdar et al. | 318/811 |
| 6,728,856 B2 | 4/2004 | Grosbach et al. | 711/202 |
| 6,751,742 B1 | 6/2004 | Duhault et al. | 713/323 |
| 6,763,478 B1 | 7/2004 | Bui | 713/600 |
| 2002/0194466 A1 | 12/2002 | Catherwood et al. | 712/241 |
| 2003/0093656 A1 | 5/2003 | Masse et al. | 712/241 |
| 2004/0150439 A1 | 8/2004 | Greenfeld | 327/131 |

FOREIGN PATENT DOCUMENTS

| | | | |
|---|---|---|---|
| EP | 0 855 643 A1 | 7/1998 | G06F 9/30 |
| EP | 0 992 888 | 12/2000 | G06F 9/32 |
| EP | 0 992 889 | 12/2000 | G06F 9/32 |
| JP | 01037424 A | 2/1989 | H03M 1/82 |
| WO | 96/11443 | 4/1996 | G06F 15/78 |

OTHER PUBLICATIONS

Weaver et al., SPARC International, Inc. "The SPARC Arcitecture Manual", Version 9, pp. xiv, 137, 146-147, 200-204, 221-222, 234-236, 299, 1994-2000.

Free On-Line Dictionary of Computing (FOLDOC). htp://wombat.doc.ic.ac.uk/foldoc/ Search term: program counter, 1995.

Moon B I et al.: "A 32-bit RISC Microprocessor with DSP Functionality: Rapid Prototyping" IEICE Transactions on Fundamentals of Electronics, Communications and Computer Sciences, Institute of Electronics Information and Comm. Eng. Tokyo, JP, vol. E84-A No. 5, pp. 1339-1347, XP001060025 ISSN: 0916-8508, May 2001.

Turley J: "Balancing Conflicting Requirements When Mixing RISC, DSPs" Computer Design, Pennwell Publ. Littleton, Massachusetts, IS, vol. 37, No. 10, pp. 46, 48, 50-53, XP000860706 ISSN:0010-4566, Oct. 1998.

Levy M: "Microprocessor and DSP Technologies Unite for Embedded Applications" EDN Electrical Design News, Cahners Publishing Co., Newtown Massachusetts, US, No. Europe, pp. 73-74, 76, 78-80, XP000779113 ISSN: 0012-7515, Mar. 1998.

Intel, Pentium Processor Family Developer's Manual, vol. 3: Architrecture and Programming Manual, , pp. 3-1, 3-2, 3-15, 14-1 to 14-30, 18-7, and 25-289 to 25-292, 1995.

Intel, Embedded Intel486 Processor Family Developer's Manual, pp. 2-2, 3-17, 3-37, 4-5, 4-6, 10-1 to 10-12, 12-1 to 12-10, Oct. 1997.

Moore, M "Z80 Family Interrupt Structure". Barleywood (online), retrieved from the internet <URL: http://www.gaby.de/z80/1653.htm>, 1997.

PCT Search Report based on PCT/US02/16706, 6 pages, Mailed Sep. 27, 2002.

PCT Search Report based on PCT/US02/16705, 7 pages, Mailed Sep. 9, 2002.

PCT Search Report based on PCT/US02/16921, 4 pages, Mailed Oct. 18, 2002.

* cited by examiner

CONFIGURATION FUSES FOR SETTING PWM OPTIONS

FIELD OF THE INVENTION

The present invention relates in general to output signal generation and, more particularly, to a pulse width modulation (PWM) generator that includes configuration bits for placing PWM output signals into tri-state, active high or active low modes when the PWM module is inactive or when individual PWM outputs are not enabled.

BACKGROUND OF THE INVENTION

Processors, including microprocessors, digital signal processors and microcontrollers, operate by running software programs that are embodied in one or more series of program instructions stored in a memory. The processors run the software by fetching the program instructions from the series of program instructions, decoding the program instructions and executing them. In addition to program instructions, data is also stored in memory that is accessible by the processor. Generally, the program instructions process data by accessing data in memory, modifying the data and storing the modified data into memory.

Processors may be programmed to perform a wide variety of functions in software. In some cases, however, dedicated hardware may be included in a processor that significantly eases the processing load needed to perform certain functions. This allows the use of lower performance processor for these functions, which lowers the cost of the processor. One type of dedicated hardware that may advantageously be included in a processor is power control hardware. Power control hardware provides the capability to control circuitry and devices that use significant amounts of power. For example, power control hardware may be used to control motors, power supplies, etc.

One common mode of operation of power control hardware is pulse width modulation (PWM). In PWM, the power level is controlled by controlling the duty cycle of a signal that has only two states—active and inactive. The signal is then connected to output transistors and a load, such as a motor, to yield the equivalent of a continuously varying voltage and current.

When PWM hardware is included in a processor, external switching devices, such as transistors, must be used in order to handle significant amounts of power. These switching devices have less than perfect switching characteristics, especially when connected to devices such as motors. Problems arise with conventional PWM hardware, which has been included in current processors, in dealing with the less than perfect switching characteristics of connected switching devices.

When processors including PWM hardware drive externals devices, care must be taken to ensure that the external devices are driven to proper values at all times. This is done to avoid indeterminate states being applied to the external devices, the application of which would cause high power dissipation in and possibly damage to external devices.

In order to overcome these problems, conventional processors incorporating PWM hardware have incorporated tri-state output buffers. The tri-state output buffers cause the PWM outputs to "float" or not produce an output voltage in a tri-state mode. The tri-state mode is entered whenever the PWM module is inactive. Conventional systems also incorporate helping devices, such as resistors, which tie the PWM output pins to a termination voltage (generally either power or ground) according to the requirements of the system. The helping devices are active while the PWM output pins are tri-stated to avoid indeterminate states being applied to the external devices. The helping devices may also be weak enough that they remain active while the PWM outputs are active. In this scenario, the PWM outputs overcome the helping devices in applying output signals to the external devices in an active PWM mode.

While the conventional approach of incorporating external helping devices, such as resistors, works, it requires additional hardware, additional space on printed circuit boards to accommodate the devices and may increase the cost to implement. Moreover, conventional approaches may not permit simple system re-configuration.

Accordingly, there is a need for a new system and method for ensuring that determinate states are applied via PWM outputs under inactive conditions of the PWM module to external devices. There is a further need for a flexible approach to solving the problem that does not require resistors or devices external to the processor.

SUMMARY OF THE INVENTION

According to the present invention, configuration bits are provided that configure PWM outputs of a processor incorporating a PWM module. The configuration bits cause the PWM module to put the PWM outputs into tri-state, active high or active low modes when the PWM module is inactive or when individual PWM outputs are not enabled. The configuration bits are stored in non-volatile memory and perform the configuration after power-up of the processor and after a reset when the PWM module is generally in an inactive state.

According to an embodiment of the invention, a pulse width modulator for a processor is provided that has pulse width modulation outputs that are configured to operate based on configuration bits. The pulse width modulator includes output control logic, configuration bits and an output transistor pair. The configuration bits selectively configure output control logic. The output transistor pair has upper and lower transistors that are respectively coupled to opposing output voltage levels. When the output transistor pair is not enabled for PWM data output, the configuration bits cause the output control logic to configure the output pair to operate in one of a tri-state, active high or active low mode.

The configuration bits include a tri-state control bit that configures the output pair to operate in one of a tri-state or an active mode.

The configuration bits may further include a high device set bit that configures the output pair to operate in one of an active high or an active low mode when the tri-state control bit configures the output pair to operate in an active mode. The high device set bit may configure output pairs that output a signal to an external device in a high-side driver arrangement, such as transistor 302A.

The configuration bits may further include a low device set bit that configures the output pair to operate in one of an active high or an active low mode when the tri-state control bit configures the output pair to operate in an active mode. The low device set bit may configure output pairs that output a signal to an external device in a low-side driver arrangement, such as transistor 302B.

DETAILED DESCRIPTION

According to the present invention, configuration bits are provided that configure PWM outputs of a processor incorporating a PWM module. The configuration bits cause the PWM module to put the PWM outputs into tri-state, active high or active low modes when the PWM module is inactive or when individual PWM outputs are not enabled. The configuration bits are stored in non-volatile memory and perform the configuration after power-up of the processor and after a reset when the PWM module is generally in an inactive state.

Figure 1:
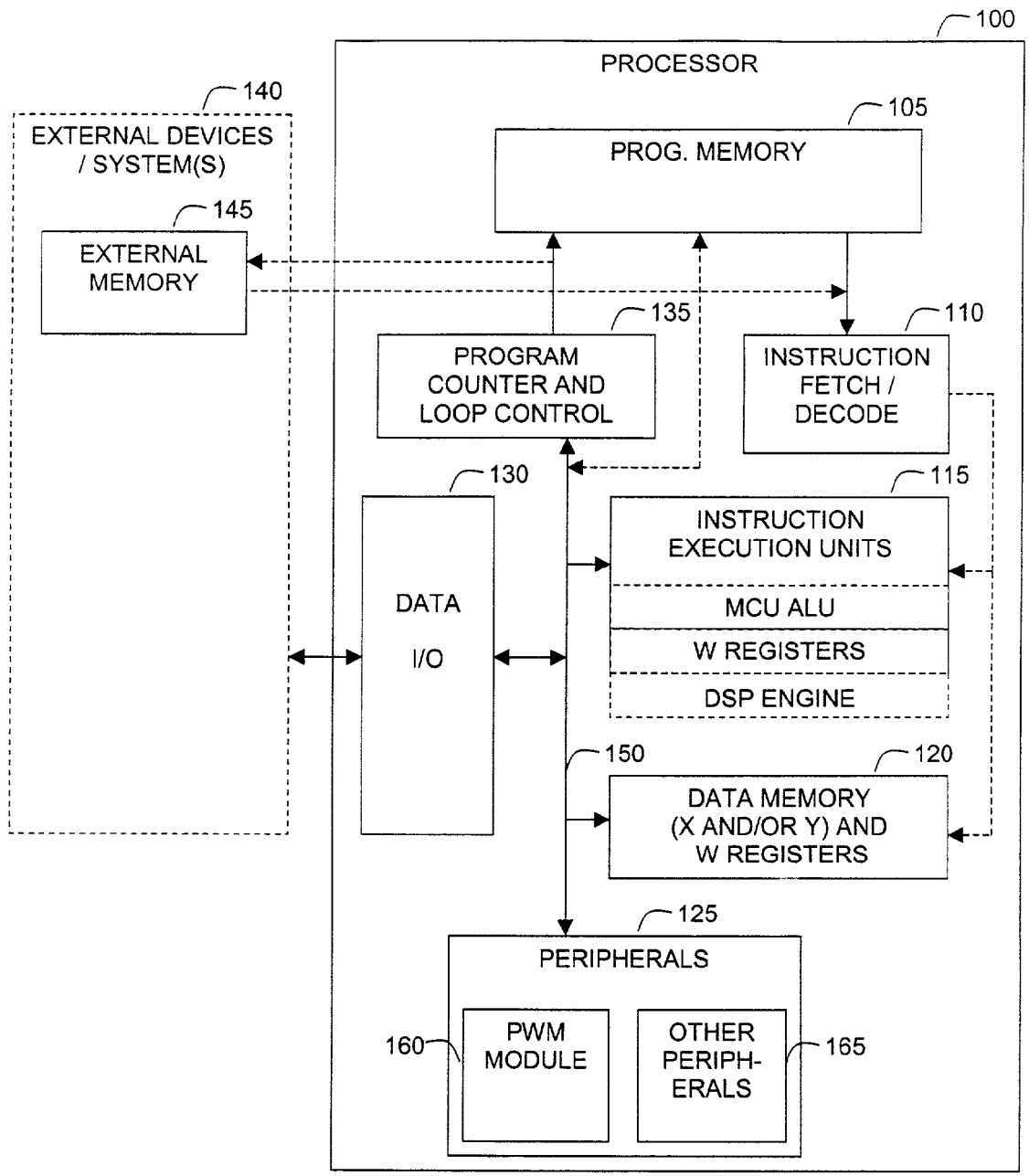
FIG. 1 depicts a functional block diagram of an embodiment of a processor chip within which the present invention may find application.

FIG. 1 depicts a functional block diagram of an embodiment of a processor chip within which the present invention may find application. Referring to FIG. 1, a processor 100 is coupled to external devices/systems 140. The processor 100 may be any type of processor including, for example, a digital signal processor (DSP), a microprocessor, a microcontroller, or combinations thereof. The external devices 140 may be any type of systems or devices including input/output devices such as keyboards, displays, speakers, microphones, memory, or other systems which may or may not include processors. Moreover, the processor 100 and the external devices 140 may together comprise a stand alone system.

The processor 100 includes a program memory 105, an instruction fetch/decode unit 110, instruction execution units 115, data memory and registers 120, peripherals 125, data I/O 130, and a program counter and loop control unit 135. The bus 150, which may include one or more common buses, communicates data between the units as shown.

The program memory 105 stores software embodied in program instructions for execution by the processor 100. The program memory 105 may comprise any type of non-volatile memory such as a read only memory (ROM), a programmable read only memory (PROM), an electrically programmable or an electrically programmable and erasable read only memory (EPROM or EEPROM) or flash memory. In addition, the program memory 105 may be supplemented with external nonvolatile memory 145 as shown to increase the complexity of software available to the processor 100. Alternatively, the program memory may be volatile memory, which receives program instructions from, for example, an external non-volatile memory 145. When the program memory 105 is nonvolatile memory, the program memory may be programmed at the time of manufacturing the processor 100 or prior to or during implementation of the processor 100 within a system. In the latter scenario, the processor 100 may be programmed through a process called in-circuit serial programming.

The instruction fetch/decode unit 110 is coupled to the program memory 105, the instruction execution units 115, and the data memory 120. Coupled to the program memory 105 and the bus 150 is the program counter and loop control unit 135. The instruction fetch/decode unit 110 fetches the instructions from the program memory 105 specified by the address value contained in the program counter 135. The instruction fetch/decode unit 110 then decodes the fetched instructions and sends the decoded instructions to the appropriate execution unit 115. The instruction fetch/decode unit 110 may also send operand information including addresses of data to the data memory 120 and to functional elements that access the registers.

The program counter and loop control unit 135 includes a program counter register (not shown) which stores an address of the next instruction to be fetched. During normal instruction processing, the program counter register may be incremented to cause sequential instructions to be fetched. Alternatively, the program counter value may be altered by loading a new value into it via the bus 150. The new value may be derived based on decoding and executing a flow control instruction such as, for example, a branch instruction. In addition, the loop control portion of the program counter and loop control unit 135 maybe used to provide repeat instruction processing and repeat loop control as further described below.

The instruction execution units 115 receive the decoded instructions from the instruction fetch/decode unit 110 and thereafter execute the decoded instructions. As part of this process, the execution units may retrieve one or two operands via the bus 150 and store the result into a register or memory location within the data memory 120. The execution units may include an arithmetic logic unit (ALU) such as those typically found in a microcontroller. The execution units may also include a digital signal processing engine, a floating point processor, an integer processor, or any other convenient execution unit.

The data memory and registers 120 are volatile memory and are used to store data used and generated by the execution units. The data memory 120 and program memory 105 are preferably separate memories for storing data and program instructions respectively. This format is a known generally as a Harvard architecture. It is noted, however, that according to the present invention, the architecture may be a Von-Neuman architecture or a modified Harvard architecture, which permits the use of some program space for data space. A dotted line is shown, for example, connecting the program memory 105 to the bus 150. This path may include logic for aligning data reads from program space such as, for example, during table reads from program space to data memory 120.

A plurality of peripherals 125 on the processor may be coupled to the bus 150. The peripherals may include pulse width modulation (PWM) module 160 and other peripherals 165, such as analog to digital converters, timers, bus interfaces and protocols such as, for example, the controller area network (CAN) protocol or the Universal Serial Bus (USB) protocol and other peripherals. The peripherals exchange data over the bus 150 with the other units. The PWM module 160 is capable of generating multiple, synchronized pulse width modulated (PWM) outputs. The PWM module 160 may be advantageously applied to a variety of power and motion control applications, such as control of Three-Phase AC Induction Motors, Switched Reluctance (SR) Motors, Brushless DC (BLDC) Motors, and Uninterruptible Power Supplies (UPSs).

The data I/O unit 130 may include transceivers and other logic for interfacing with the external devices/systems 140. The data I/O unit 130 may further include functionality to permit in circuit serial programming of the Program memory through the data I/O unit 130.

Figure 2:
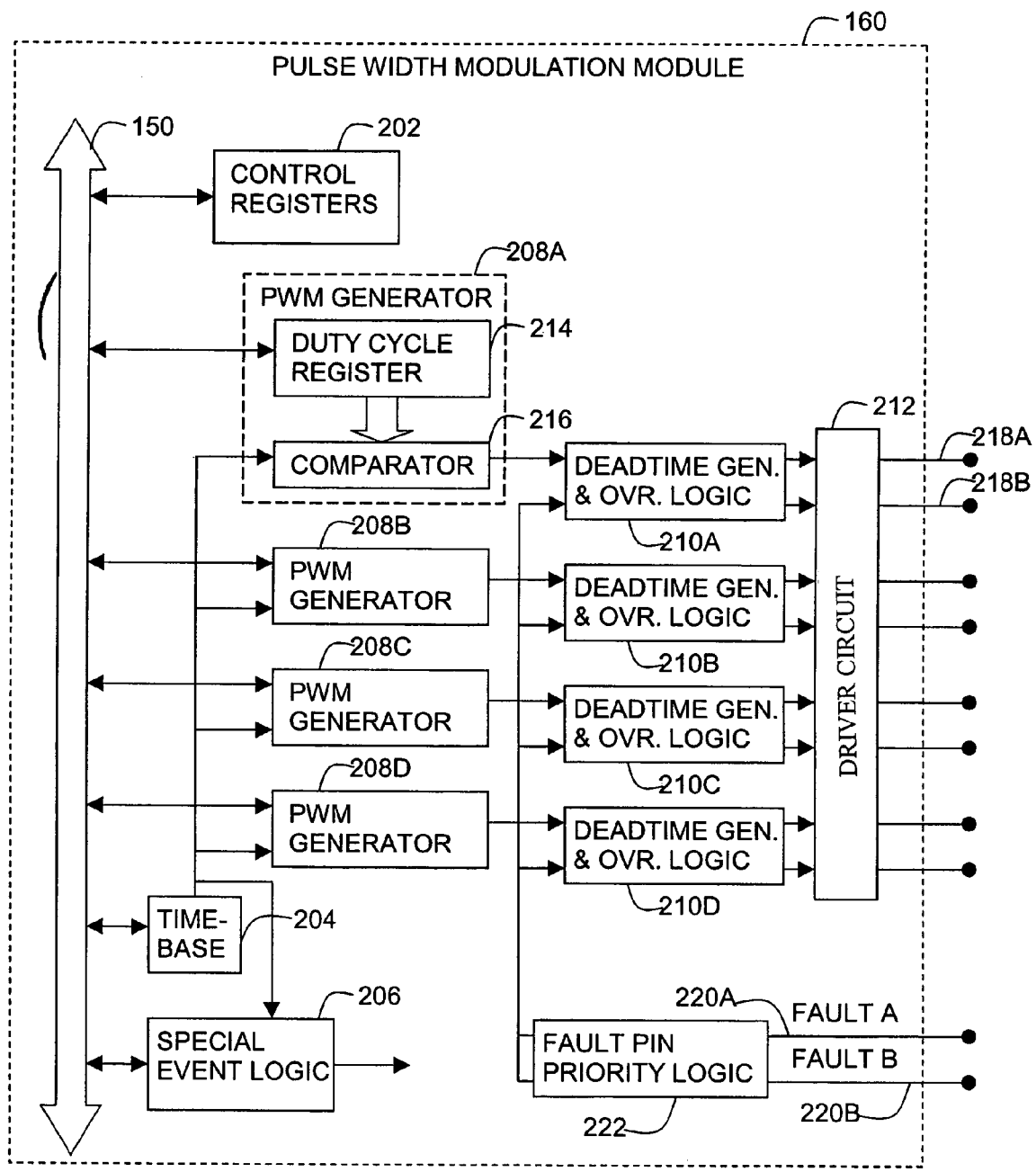
FIG. 2 depicts a functional block diagram of a pulse width modulation (PWM) module for use in a processor, such as that shown in FIG. 1.

FIG. 2 depicts a functional block diagram of a pulse width modulation (PWM) module 160, for use in a processor 100, such as that shown in FIG. 1. PWM module 160 includes control registers 202, timebase 204, special event logic 206, at least one pulse width modulation generator, such as PWM generators 208A, 208B, 208C, and 208D, for each PWM generator, a deadtime generator, such as deadtime generators 210A, 210B, 210C, and 210D, and output driver circuitry 212. Bus 150 is communicates data among units of processor 100 and elements of PWM module 160. In particular, bus 150 communicates data with control registers 202, timebase 204, special event logic 206, and the at least one PWM generator, such as PWM generators 208A, 208B, 208C, and 208D.

Control registers 202 store values that are modifiable in software and provide the capability to control and configure the operation of the elements of PWM module 160. Control registers 202 may include a plurality of control registers, each control register including a plurality of bits. Each control register may be read, under software control, to determine the configuration and operational state of elements of PWM module 160. Likewise, each control register may be written, under software control, to set the configuration and control the operation of element of PWM module 160. For example, bits in control registers 202 may provide the capability to enable or disable the generation of PWM signals by PWM module 160. Bits in control register 202 may provide the capability to set the polarity and timing of signals output by PWM module 160, such as the frequency, duty cycle, and dead time of such signals. Bits in control registers 202 may provide the capability to enable, disable, and configure special event triggering, fault triggering, override operation, and other functions of PWM module 160.

Timebase 204 generates timing signals that are used by other elements of PWM module 160, such as special event logic 206 and the PWM generators 206A–D. Timebase 204 may include registers, counters, comparators, and other circuitry that operate with a timing clock signal to provide the capability to generate timing signals having programmable parameters. For example, timebase 204 may provide the capability to program parameters such as: the count direction of included counters, the resolution and prescaling of the timing clock used to generate the timebase signals, the mode of operation of timebase interrupts, postscaling of timebase signals, and the mode of operations of the timebase, such as continuous, free running, single shot, etc.

Special event logic 206 generates trigger signals that provide the capability to synchronize operations external to PWM module 160 with the operation of PWM module 160. For example, in an embodiment of processor 100 in which other peripherals 165 includes one or more analog to digital (A/D) converters, the operation of such A/D converters may be synchronized to the operation of PWM module 160 using the trigger signals generated by special event logic 206. Special event logic 206 uses signals generated by timebase 204 to generate trigger signals that are synchronized with selected points in the period of the PWM signals generated by PWM module 160.

Each PWM generator generates a PWM signal, which is input to a deadtime generator. Each PWM generator, such as PWM generator 208A, may include a duty cycle register, such as duty cycle register 214, a comparator, such as comparator 216, and associated circuitry. Duty cycle register 214 stores a value that controls the duty cycle of the PWM signals. The duty cycle of a PWM signal is the fraction of each complete PWM cycle that the signal is in the active state. Duty cycle register 214 typically includes a buffer register, which is accessible by software, and a comparison register, which stores the actual compare value used in each PWM cycle. The value in the comparison register is compared by comparator 216, to a value generated by timebase 204. The status of this comparison controls the signals output from comparator 216, which, in turn, control whether the PWM signal is in the active or inactive state.

The output from each comparator, such as comparator 216, is input to a deadtime generator, such as deadtime generator 210A. Deadtime generator 210A may pass through the signal from comparator 216 without alteration, or deadtime generator 210A may alter the signal. Deadtime generator 210A may generate a set of complementary PWM signals based on the signal from comparator 216. Complementary signals are signals that are arranged so that when one signal is active, the other signal is inactive. When the active signal becomes inactive, the inactive signal becomes active, and so on. Deadtime generator 210 also inserts deadtime into the complementary signals. Deadtime is a period during which neither complementary signal is active.

The complementary PWM signals generated by each deadtime generator, such as deadtime generator 210A, is input to output driver circuitry 212, which includes circuitry of sufficient capacity to drive circuitry external to processor 100. The drive signals are supplied to external circuitry via processor pins, such as pins 218A and 218B.

Fault inputs 220A and 220B provide the capability to drive one or more of the PWM outputs to a defined state. Such a function is useful if a fault occurs in the external circuitry that is controlled by the PWM outputs of processor 100. The function of the fault inputs is performed directly in hardware, so that fault events can be managed quickly. Examples of faults that may occur include failure of an external switching device, such as a transistor, short circuit of external circuitry or devices, such as a motor, overcurrent detected in external circuitry or devices, a fault in the power supply, etc. Fault pin priority logic 222 provides the capability to prioritize the function of the fault inputs if more than one input becomes active. The signals output from fault pin priority logic 222 are input to the deadtime generators 210A–210D. The deadtime generators also include fault override logic that overrides the function of the deadtime generator in response to a fault signal from fault pin priority logic 222, if so configured.

Included in control registers 202 are registers that control the configuration and function of PWM module 160 in response to activation of one or more fault inputs. In particular, the registers provide the capability to define whether a particular pair of PWM outputs associated with a deadtime generator, such as PWM outputs 218A and 218B and deadtime generator 210A, are controlled by the fault inputs. If enabled, the override logic in the deadtime generator will respond to a fault output signal 224 from fault pin priority logic 222 and perform a defined action.

Control registers 202 store values that define the state of each PWM output in response to a fault signal input to each fault input. Each PWM output can be defined to be driven inactive or active in response to the fault signal input to each fault input. For example, PWM output 218A may be defined to be driven inactive in response to a fault signal on fault input 220A and may be defined to be driven active in response to a fault signal on fault input 220B. If a PWM output pair associated with one deadtime generator is in the complementary output mode and both PWM outputs are defined to be driven to the active state in response to a fault signal input to a fault input, both PWM outputs would be driven active, which is not desirable. In this situation, the override logic in the deadtime generator will give priority to one PWM output, drive that PWM output active, and drive the other PWM output inactive.

Fault pin priority logic 222 provides prioritization among the fault inputs. If more than one fault input has been defined to control a particular PWM output and at least two such fault inputs become active concurrently, fault pin priority logic 222 selects one of the fault inputs to be given priority. The PWM outputs are driven to the fault states defined for the fault input that has been given priority, and the other fault inputs are ignored. Fault priority logic 222 generates a fault output signal 224 that indicates the selected fault input. Fault output signal 224 in input to the deadtime generators, such as deadtime generator 210A, which drives its associated PWM outputs to the fault state defined for the selected fault input.

Each of the fault inputs has two modes of operation:

Latched Mode: When the fault input is driven active, the PWM outputs will remain in the defined fault states until the fault input is driven inactive and the fault condition is cleared in software. The PWM outputs will be enabled for normal, non-fault operation once the fault condition is cleared in software.

Cycle-by-Cycle Mode: When the fault input is driven active, the PWM outputs will remain in the defined fault states until the fault input is driven inactive. When the fault input is driven inactive, the PWM outputs will return to normal, no-fault operation at the beginning of the next PWM period.

The mode of operation of each fault input is defined in registers included in control registers 202.

Each fault input may also be controlled directly by software. Processor 100 can be configured so that software can directly drive the active or inactive levels of each fault input.

Figure 3:
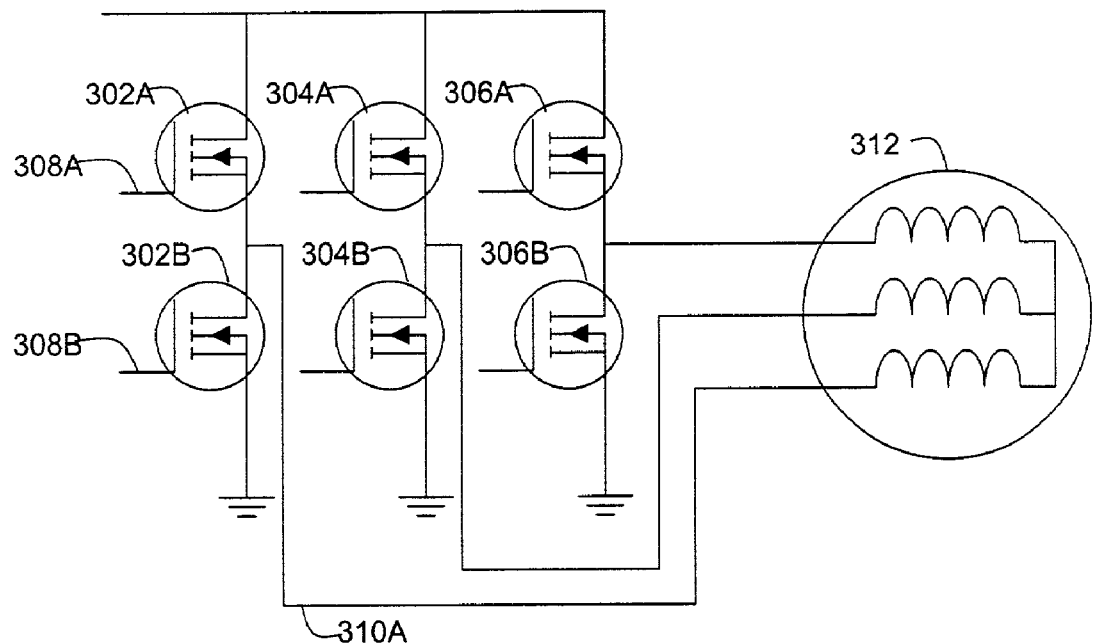
FIG. 3 depicts an exemplary external circuit, which may be driven by complementary PWM signals generated by the circuit shown in FIG. 2.

An example of an external circuit that may be driven by complementary PWM signals is shown in FIG. 3. In this example, three transistor pairs, a first pair including transistors 302A and 302B, a second pair including transistors 304A and 304B, and a third pair including transistors 306A and 306B, are connected to complementary PWM outputs of processor 100, either directly or via appropriate additional circuitry. For example, the signal on pin 218A, shown in FIG. 2, may be connected to input 308A of transistor 302A and the complementary signal on pin 218B, also shown in FIG. 2, may be connected to input 308B of transistor 302B. One of skill in the art would recognize that pins 218A and 218B would typically be connected to inputs 308A and 308B, respectively, via appropriate, and well-known, circuitry. Other complementary PWM outputs from processor 100 may similarly be connected to inputs to other transistor pairs.

The output from each transistor pair is formed at a connection between the transistors in the pair. In the example shown, which uses transistors that are MOSFETs, the output of each transistor pair is formed at the connection between the source of the upper transistor and the drain of the lower transistor. For example, output 310A is formed at the connection of the source of transistor 302A and the drain of transistor 302B. The outputs of the transistor pairs are connected to windings of motor 312 and supply the power that drives motor 312.

In the example of FIG. 3, MOSFET transistors and a three-phase AC induction motor are illustrated. One of skill in the art would, of course, recognize that other types of transistors and other types of motors could be used as well as those illustrated. For example, transistors, such as bipolar transistors, insulated-gate bipolar transistors, and other well-known types of transistors, or motors, such as switched reluctance (SR) motors, or brushless DC (BLDC) motors could be used instead of those illustrated, with well-known modifications to the circuitry. Likewise, as is well-known, the PWM signals could be used to control other applications, such as switching power supplies, etc.

Figure 4:
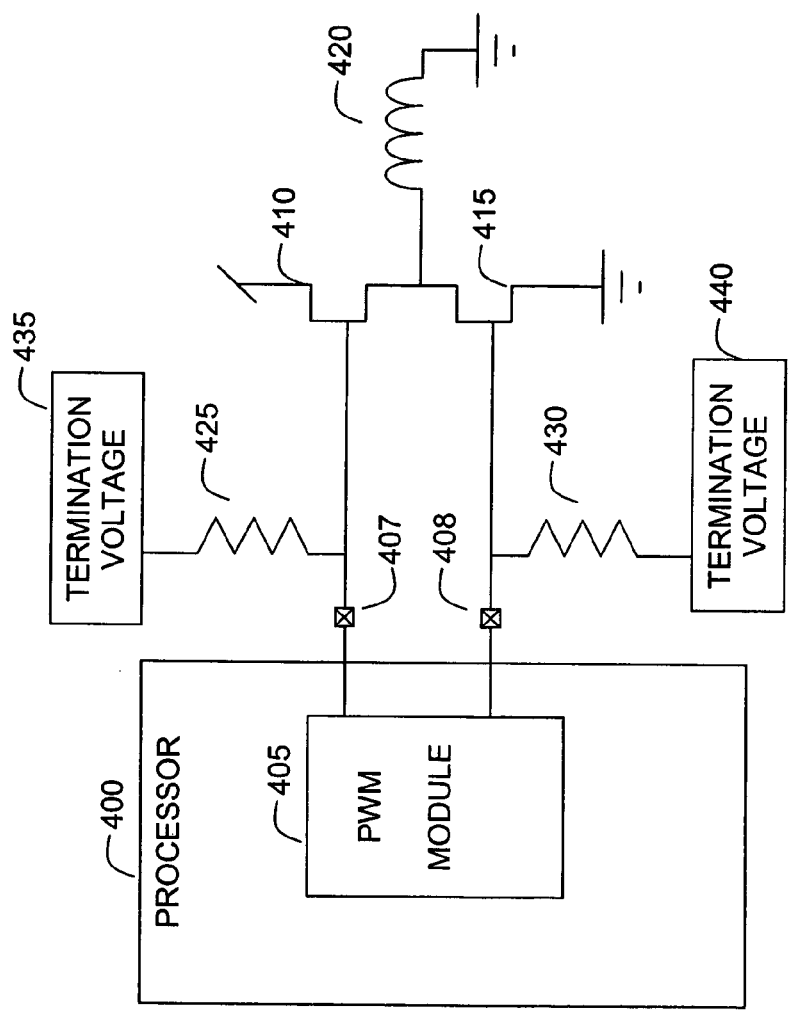
FIG. 4 depicts an illustration of a prior art embodiment for preventing indeterminate voltages from being applied to external devices when PWM outputs are not enabled.

FIG. 4 depicts an illustration of a prior art embodiment for preventing indeterminate voltages from being applied to external devices. Referring to FIG. 4, a processor 400 incorporates PWM logic 405. The PWM logic 405 does not incorporate configuration bits according to the present invention for configuring PWM outputs. Rather, the PWM logic 405 produces PWM outputs 407 and 408 that are tri-stated when the PWM logic 405 is not active and produces PWM data when active.

The PWM output 407 is coupled to the gate of an external transistor 410, via appropriate and well known circuitry, that is an upper transistor connected to the power supply. The PWM output 408 is coupled to the gate of an external transistor 415, via appropriate and well known circuitry, that is a lower transistor connected to the ground voltage. The transistors are coupled together and generate an output signal to drive a load such as the coil 420 as shown and as discussed above.

When the PWM logic is inactive, such as during and after a power up sequence and after a reset of the processor 400, the PWM outputs 407 and 408 are placed in a tri-state mode. For this reason, these outputs would "float" to indeterminate values causing power dissipation and possibly high current through the devices 410, 415 and 420. To counteract this problem, conventionally resistors 425 and 430 are coupled between the outputs 407 and 408 and termination voltages 435 and 440. The resistors 425 and 430 are generally small enough to allow charging the transistors 410 and 415 to known states in a reasonably short amount of time to avoid damage. However, the resistors are not large enough to overpower the PWM output signals when they are active.

The termination voltage 435 may be different from the termination voltage 440. This is because the upper and lower devices 410 and 415 respectively may require different polarity signals to place them in the "OFF" state. In general, the termination voltages 435 and 440 are chosen to place the transistors 410 and 415 into the OFF state when the PWM outputs 407 and 408 are tri-stated.

Figure 5:
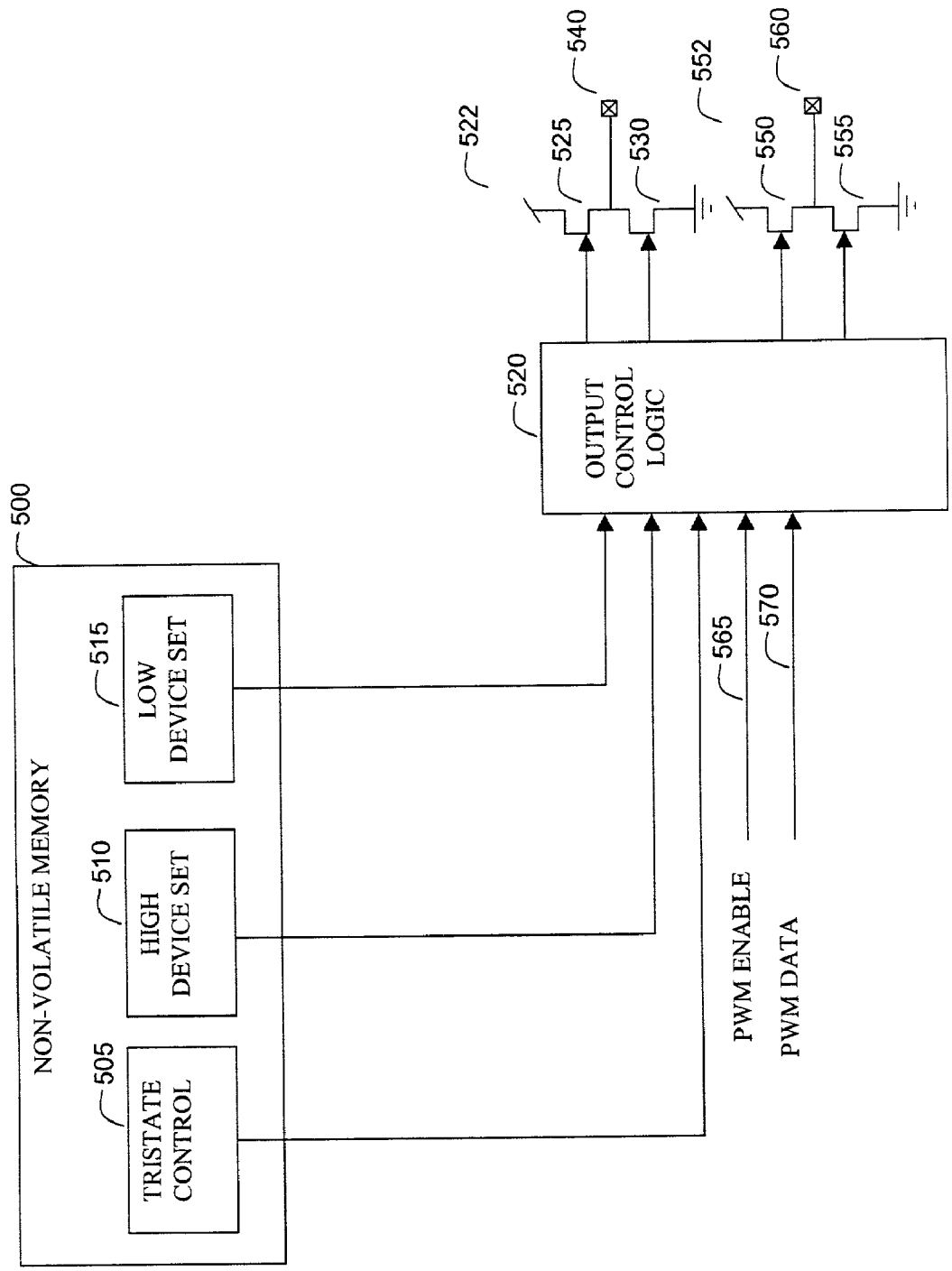
FIG. 5 depicts an embodiment of the present invention for using configuration bits stored in non-volatile memory to control PWM output signal generation when PWM data outputs are not enabled.

FIG. 5 depicts an embodiment of the present invention for using configuration bits stored in non-volatile memory to control PWM output signal generation to avoid the resistor scheme of the prior art if the user desires. Referring to FIG. 5, a non-volatile memory 500 is provided on processor 100 embodiments of the present invention or as part of the PWM module 160 according to the present invention. The non-volatile memory may be read only memory (ROM), electronically programmable read only memory (EPROM), electronically erasable programmable read only memory (EEPROM), flash memory or any other type of non-volatile memory. The non-volatile memory 500 includes configuration bits as shown. The configuration bits include a tri-state control bit 505, a high device set bit 510 and a low device set bit 515. The configuration bits (the operation of each of which is explained below) are coupled to output control logic 520.

The output control logic 520 is coupled to output transistor pairs that each drive a PWM output signal. Two output transistor pairs for driving PWM outputs coupled to the upper and lower transistors of external devices are shown which may be representative, for example, of output signals 218A and 218B shown in FIG. 2.

The output transistor pair 522 drives a PWM output signal that is coupled to an upper external transistor that drives an external load such as transistor 302A shown in FIG. 3. The output transistor pair 552 drives a PWM output signal that is coupled to an lower external transistor that drives an external load such as transistor 302B shown in FIG. 3.

The output control logic 520 receives as inputs each of the configuration bits 505–515. The output control logic also receives a PWM signal for each PWM output signal pair 540 and 560. The output control logic also receives a PWM data signals 570 for outputting on each PWM output channel when the PWM module and individual PWM output channels are enabled. The PWM data signals 570 may be generated, for example, by the PWM generators 208A–D as shown in FIG. 2.

The PWM enable signals 565 are generally set to disable the PWM outputs during and after a power up of the processor 100 and also after a reset. They may also be disabled under program control and in other ways.

When the PWM module and PWM data channels are enabled by the PWM enable signal 565, the output control logic 520 is configured to drive each transistor pair 522 and 552 to place the PWM data from the PWM data signals 570 onto the respective PWM output pins 540 and 550.

When the PWM enable signals 565 indicate that PWM channels are disabled, then the output control logic stimulates the transistors within each transistor pair 522 and 552 to either place each output transistor pair in a tri-state mode, an active high mode or and active low mode. Considering the transistor pair 522, for example, in the tri-state mode, the output control logic drives both transistor 525 and 530 to the OFF state. In the active high mode, the output control logic 520 drives transistor 525 to the ON state and transistor 530 to the OFF state. In the active low mode, the output control logic 520 drives transistor 525 to the OFF state and transistor 530 to the ON state.

Whether each transistor pair 522 and 552 is place in a tri-state, active high or active low mode when the PWM enable signal is set to disable is determined by the configuration bits according to the description below.

The tri-state control bit determines whether output control logic causes the transistor pairs 522 and 552 to assume tri-state conditions when the corresponding PWM enable signal is set to disable (or not enabled). According to one embodiment of the invention, the tri-state control bit causes the output control logic 520 to place the device pairs into the tri-state condition when the tri-state control bit is in the un-programmed state. When the tri-state control bit is in the programmed state, the tri-state control bit causes the output control logic 520 configure the transistor pair 522 to assume either active high or active low states according to the high device set bit 510 and causes the output control logic 520 to configure the transistor pair 552 to assume either active high or active low states according to the low device set bit 510.

According to one embodiment of the present invention, for example, when the tri-state control bit 505 is programmed, and the high device set bit is un-programmed, the output control logic drives the transistor pair 522 to produce an active high voltage level, i.e., the output 540 is driven to the power voltage. When the tri-state control bit 505 is programmed, and the high device set bit is programmed, the output control logic drives the transistor pair 522 to produce an active low voltage level, i.e., the output 540 is driven to the ground or low voltage level. The output 540 is provided to an external "high" device such as the transistor 302A.

According to another embodiment of the present invention, for example, when the tri-state control bit 505 is programmed, and the low device set bit is un-programmed, the output control logic drives the transistor pair 522 to produce an active high voltage level, i.e., the output 560 is driven to the power voltage. When the tri-state control bit 505 is programmed, and the low device set bit is programmed, the output control logic drives the transistor pair 522 to produce an active low voltage level, i.e., the output 560 is driven to the ground or low voltage level. The output 560 is provided to an external "low" device such as the transistor 302B.

In this manner, a user may program the configuration bits to match a particular system configuration. The configuration bits cause the PWM output signals to drive external devices such as the transistor pair comprising transistors 302A and 302B to known states that will not dissipate power or cause damage to the devices. In addition, the need for external resistors is avoided. Moreover, the configuration bits may be reprogrammed in non-volatile memory in some embodiments to permit flexible implementation within a system.

The control bits 510 and 515 also may be used to control the polarities of the PWM signals when the PWM module is enabled and operating. Setting the control bits in non-volatile memory provides a robust solution that is operable after power up and reset events and also avoids problems of mis-setting values in software which would may arise if volatile memory is used.

While specific embodiments of the present invention have been illustrated and described, it will be understood by those having ordinary skill in the art that changes may be made to those embodiments without departing from the spirit and scope of the invention. It will be understood, for example, that the assignment of functionality to programmed and unprogrammed states is arbitrary and may be changed accordingly.

What is claimed is:

1. A pulse width modulator for a processor having pulse width modulation (PWM) outputs that are configured to operate based on configuration bits when pulse width modulation outputs are not enabled, comprising:
   output control logic;
   configuration bits for selectively configuring the output control logic; and
   an output transistor pair having upper and lower transistors that are respectively coupled to opposing output voltage levels;
   the configuration bits causing the output control logic to configure the output transistor pair to operate in a mode selects from a group of modes consisting of tri-state, active high and active low modes when the output transistor pair is not enabled for PWM data output.

2. The pulse width modulator according to claim 1, wherein the configuration bits include a tri state control bit that configures the output transistor pair to operate in one of a tri-state or an active mode.

3. The pulse width modulator according to claim 2, wherein the configuration bits include a high device set bit that configures the output transistor pair to operate in one of an active high or an active low mode when the tri-state control bit configures the output transistor pair to operate in an active mode.

4. The pulse width modulator according to claim 3, wherein the output transistor pair outputs a signal to an external device in an high arrangement.

5. The pulse width modulator according to claim 2, wherein the configuration bits include a low device set bit that configures the output transistor pair to operate in one of an active high or an active low mode when the tri-state control bit configures the output transistor pair to operate in an active mode.

6. The pulse width modulator according to claim 5, wherein the output transistor pair outputs a signal to an external device in an low arrangement.

7. The pulse width modulator according to claim 1, further comprising a memory to store said plurality of configuration bits.

8. A processor comprising:
a processing core;
memory operably associated with said processing core;
a plurality of pulse width modulation (PWM) outputs;
output control logic coupled to each of the plurality of PWM outputs, said output control logic comprising at least one input to receive a plurality of configuration bits from said memory; and wherein
the output control logic, in response to receiving the configuration bits, configures respective PWM outputs to operate in a mode selects from a group of modes consisting of tri-state, active high and active low modes if the respective PWM outputs are not enabled for PWM data output.

9. The processor according to claim 8, wherein the configuration bits include a tri state control bit to configure the respective PWM output to operate in one of a tri-state or an active mode.

10. The processor according to claim 9, wherein the configuration bits include a high device set bit to configure the respective PWM outputs to operate in one of an active high or an active low mode when the tri-state control bit configures the respective PWM outputs to operate in an active mode.

11. The processor according to claim 10, wherein the respective PWM outputs provide a signal to an external device in an high arrangement.

12. The processor according to claim 9, wherein the configuration bits include a low device set bit to configure the respective PWM outputs to operate in one of an active high or an active low mode when the tri-state control bit configures the respective PWM outputs to operate in an active mode.

13. The processor according to claim 12, wherein the respective PWM outputs provides respective signal to an external device in an low arrangement.

14. A method comprising:
receiving a plurality of configuration bits at an output controller of a pulse width modulator, the output controller being coupled to a plurality of pulse width modulated (PWIVI) outputs; and
if respective PWM outputs are not enabled for PWM data output, configuring individual ones of the plurality of PWM outputs to operate in a tri-state, active high or active low mode in response to receiving the plurality of configuration bits.

15. The method according to claim 14, wherein each of the plurality of PWM outputs comprises an output transistor pair having upper and lower transistors, the upper and lower transistor coupled, respectively, to opposing output voltage levels.

16. The method according to claim 14, further comprising configuring the respective PWM outputs to operate in one of a tri-state or an active mode based, at least in part, on a tri-state control bit.

17. The method according to claim 16, further comprising configuring the respective PWM outputs to operate in one of an active high or an active low mode in response to a high device set bit, if the respective PWM outputs are operating in an active mode.

18. The method according to claim 17, further comprising providing an output signal from the respective PWM outputs to an external device in an high arrangement.

19. The method according to claim 16, further comprising configuring the respective PWM outputs to operate in one of an active high or an active low mode in response to a low device set bit, if the respective PWM outputs are operating in an active mode.

20. The method according to claim 19, further comprising providing an output signal from the respective PWM outputs to an external device in an low arrangement.

* * * * *